US 8,825,948 B2

(12) United States Patent
Oner

(10) Patent No.: US 8,825,948 B2
(45) Date of Patent: Sep. 2, 2014

(54) MEMORY CONTROLLER WITH EMULATIVE INTERNAL MEMORY BUFFER

(75) Inventor: Koray Oner, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 120 days.

(21) Appl. No.: 12/927,633

(22) Filed: Nov. 17, 2010

(65) Prior Publication Data

US 2012/0124280 A1 May 17, 2012

(51) Int. Cl.
G06F 13/00 (2006.01)
G06F 13/28 (2006.01)
G06F 13/16 (2006.01)
G11C 29/02 (2006.01)
G06F 11/27 (2006.01)
G11C 29/56 (2006.01)

(52) U.S. Cl.
CPC ............ *G06F 13/1673* (2013.01); *G06F 11/27* (2013.01); *G06F 2213/0038* (2013.01); *G11C 29/02* (2013.01); *G11C 2029/5602* (2013.01)
USPC .................... 711/105; 711/154; 711/E12.001

(58) Field of Classification Search
CPC ....................................................... G06F 11/27
See application file for complete search history.

(56) References Cited

U.S. PATENT DOCUMENTS

| 2002/0120815 | A1* | 8/2002 | Zahavi et al. ................. 711/118 |
| 2003/0023914 | A1* | 1/2003 | Taylor et al. ................. 714/733 |
| 2009/0158106 | A1* | 6/2009 | Whetsel ........................ 714/729 |
| 2011/0185179 | A1* | 7/2011 | Swaminathan et al. ...... 713/176 |
| 2012/0054566 | A1* | 3/2012 | Gupta et al. ................. 714/723 |

* cited by examiner

Primary Examiner — Eric S Cardwell
(74) Attorney, Agent, or Firm — Oblon, Spivak, McClelland, Maier & Neustadt, L.L.P.

(57) ABSTRACT

The present application discloses a memory controller for accessing an external memory device. The memory controller comprises a bus interface and an internal memory buffer capable of accessing the bus interface. The internal memory buffer operates as an on-chip storage. In various embodiments of the disclosure, the internal memory buffer operates during a testing of a chip containing the memory controller. For example, the internal memory buffer may emulate the external memory device in response to an input signal. Moreover, in various embodiments of the disclosure, the external memory device may be a dynamic random access memory (DRAM), while the internal memory buffer may be a static random access memory (SRAM). The memory controller may be adapted to automated test equipment (ATE). Moreover, the memory controller may be incorporated onto a system-on-a-chip (SOC) along with one or more agents.

20 Claims, 4 Drawing Sheets

MEMORY CONTROLLER WITH EMULATIVE INTERNAL MEMORY BUFFER

BACKGROUND OF THE INVENTION

1. Field of the Invention

The present invention is generally in the field of electronic circuits and systems. More specifically, the present invention is in the field of control circuits and systems.

2. Background Art

Memory controllers form an integral part of many computer systems. For instance, memory controllers may manage the flow of data to external memory devices. Memory controllers may also periodically refresh dynamic memory devices to prevent data loss. To ensure suitability for consumer use, memory controllers, including the chip on which they reside, are often subject to rigorous tests with automated test equipment (ATE). Typically, ATE supplies a chip containing a memory controller with a test vector and determines whether the chip responds according to design specifications.

However, it is often difficult to test a chip containing a conventional memory controller at the full rate that the conventional memory controller transfers data to a memory device (i.e., "at-speed"). As a result, conventional approaches to testing memory controllers typically do so at reduced speeds. Though potentially useful, reduced speed testing does not optimize test times and may inaccurately represent the functionality of a chip containing a memory controller at-speed. Moreover, conventional memory controllers have typically required auxiliary tests to accommodate manufacturing variations and the non-deterministic behavior of internal interfaces. Unfortunately, these auxiliary tests often increase test times.

Accordingly, there is a need to overcome the drawbacks and deficiencies in the art by providing a memory controller that facilitates efficient at-speed testing with a single set of functional test vectors.

SUMMARY OF THE INVENTION

The present application is directed to a memory controller with an emulative internal memory buffer, substantially as shown in and/or described in connection with at least one of the figures, as set forth more completely in the claims.

DETAILED DESCRIPTION OF THE INVENTION

Figure 1:
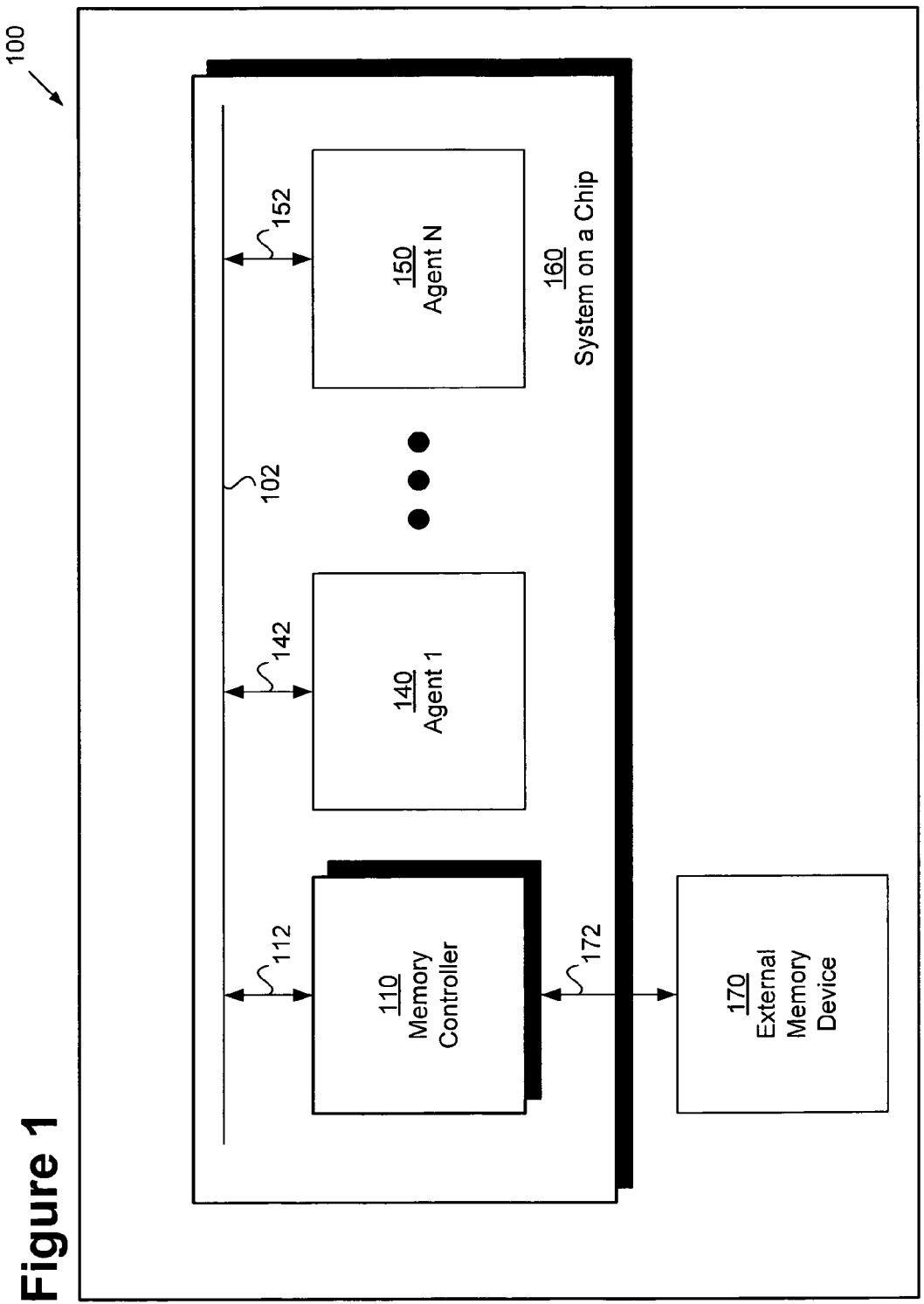
FIG. 1 illustrates a block diagram that includes a computer system that employs at least one memory controller, according to one embodiment of the present invention.

The present invention is directed to a memory controller with an emulative internal memory buffer. Although the present invention is described with respect to specific embodiments, the principles of the invention, as defined by the claims appended herein, can obviously be applied beyond the specifically described embodiments of the invention described herein. Moreover, in the description of the present invention, certain details have been left out in order not to obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals.

Memory controllers form an important part of many computer systems. They often manage the data flow to external memory devices and may periodically refresh dynamic memory devices. Before shipping, a chip containing a memory controller is usually subject to a testing phase by automated test equipment (ATE).

Figure 4:
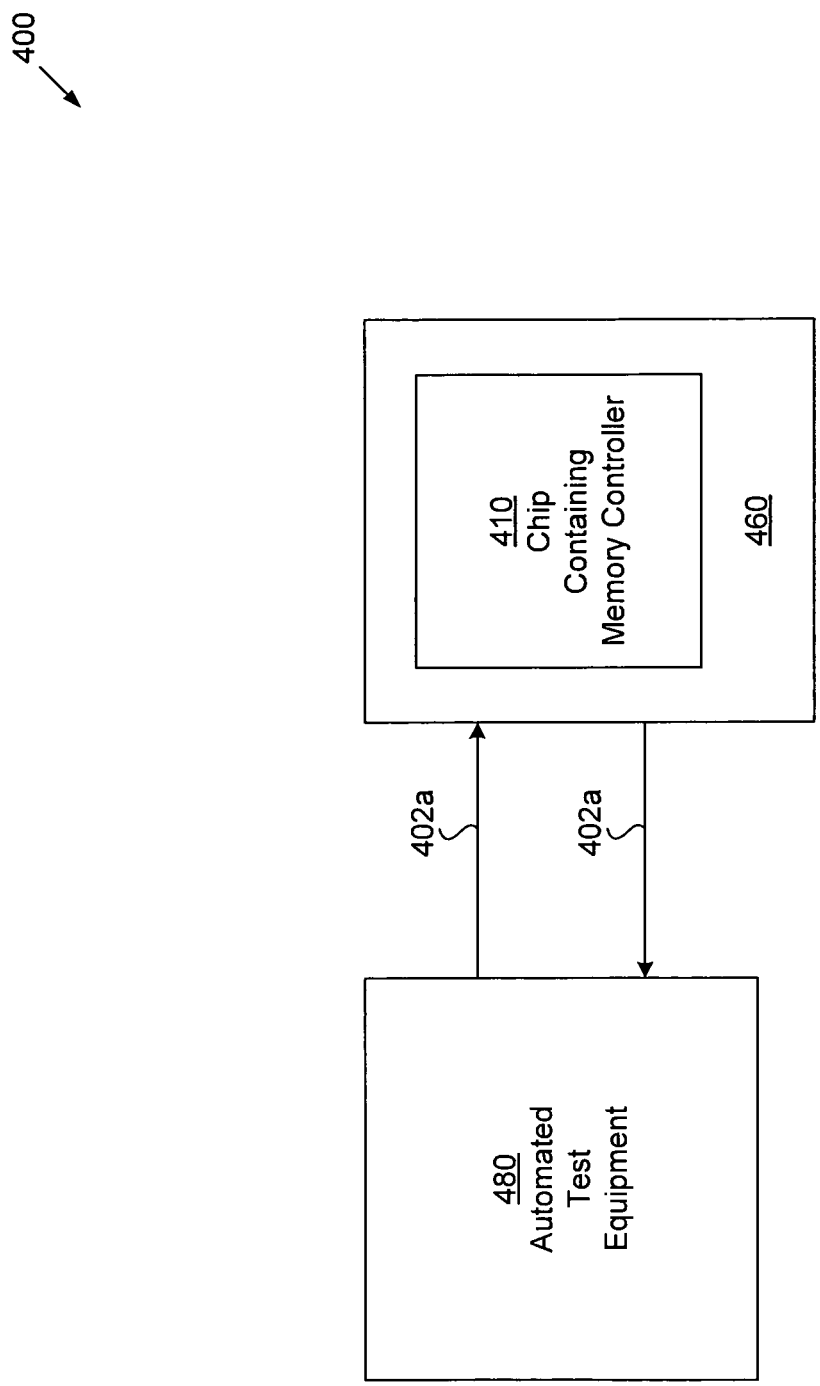
FIG. 4 shows a test environment including automated test equipment.

Referring to FIG. 4 first, FIG. 4 shows ATE environment 400. As shown, ATE environment 400 may comprise ATE 480 and device under test (DUT) 460. DUT 460 may internally include chip 410, which contains one or more memory controllers, agents, or external memory devices. ATE 480 may supply input signal 402a to DUT 460. Input signal 402a may comprise one or more test vectors that test portions of DUT 460 such as chip 410. DUT 460 may supply data signals 402b that reflect whether the portions of DUT 460, such as chip 410, respond according to design specifications.

However, efficiently testing a chip containing a conventional memory controller presents difficulties. For example, the increased speeds of many memory controllers often exceed the rate at which ATE can robustly supply test vectors. As a result, conventional memory controllers are usually tested at reduced speeds, and not at-speed. Unfortunately, reduced speed testing often increases test times and may not accurately represent at-speed functionality. Moreover, reduced speed testing often makes it difficult to uncover speed faults and other defects that are typically only detectable during at-speed testing.

Additionally, ATE is often unable to test a chip containing a conventional memory controller with a single set of functional test vectors. Within the chip, manufacturing variations, such as different portions of high-speed interfaces having different carrier mobilities, may require auxiliary tests. Similarly, the physical interface layer (PHY) and tri-state buffers of a conventional memory controller often require auxiliary tests to accommodate non-deterministic timing sources. Moreover, the input and output pads on a conventional memory controller are often characterized by higher voltages, and therefore higher voltage variations, than other portions of the memory controller. It is therefore desirable to provide a memory controller that allows its chip to be tested at-speed with a single set of test vectors. The memory controller may also present benefits during normal, non-testing operation.

In view of these and other problems, FIG. 1 shows computer system 100 in accordance with one embodiment of the present invention. Computer system 100 may include system-on-a-chip (SOC) 160 and external memory device 170. Control signals 172 may connect SOC 160 to external memory device 170. External memory device 170 may be a dynamic random access memory (DRAM) device or chip, such as a double data rate (DDR) DRAM or a standard data rate (SDR) DRAM.

SOC 160 may comprise on-chip interconnect 102, a plurality of agents, such as agent 140 (e.g., "Agent 1") through agent 150 (e.g., "Agent N"), and memory controller 110. On-chip interconnect 102 may be a bus, such as a split bus that passes address and data components. On-chip interconnect 102 may also comprise a dual state or tri-state bus, for example. Agents 140 through 150 may include one or more central processing units (CPUs) or logic cores, for example. Agents 140 through 150 may communicate with on-chip interconnect 102 through respective communication signals 142 through 152. A tri-state buffer (not shown in FIG. 1) may couple any of memory controller 110 and agents 140 through 150 to on-chip interconnect 102.

Memory controller 110 may communicate with on-chip interconnect 102 through communication signals 112. Control signals 172 allow memory controller 110 to access external memory device 170. For instance, control signals 172 may allow memory controller 110 to supply address, data, or command signals to external memory device 170.

Figure 2:
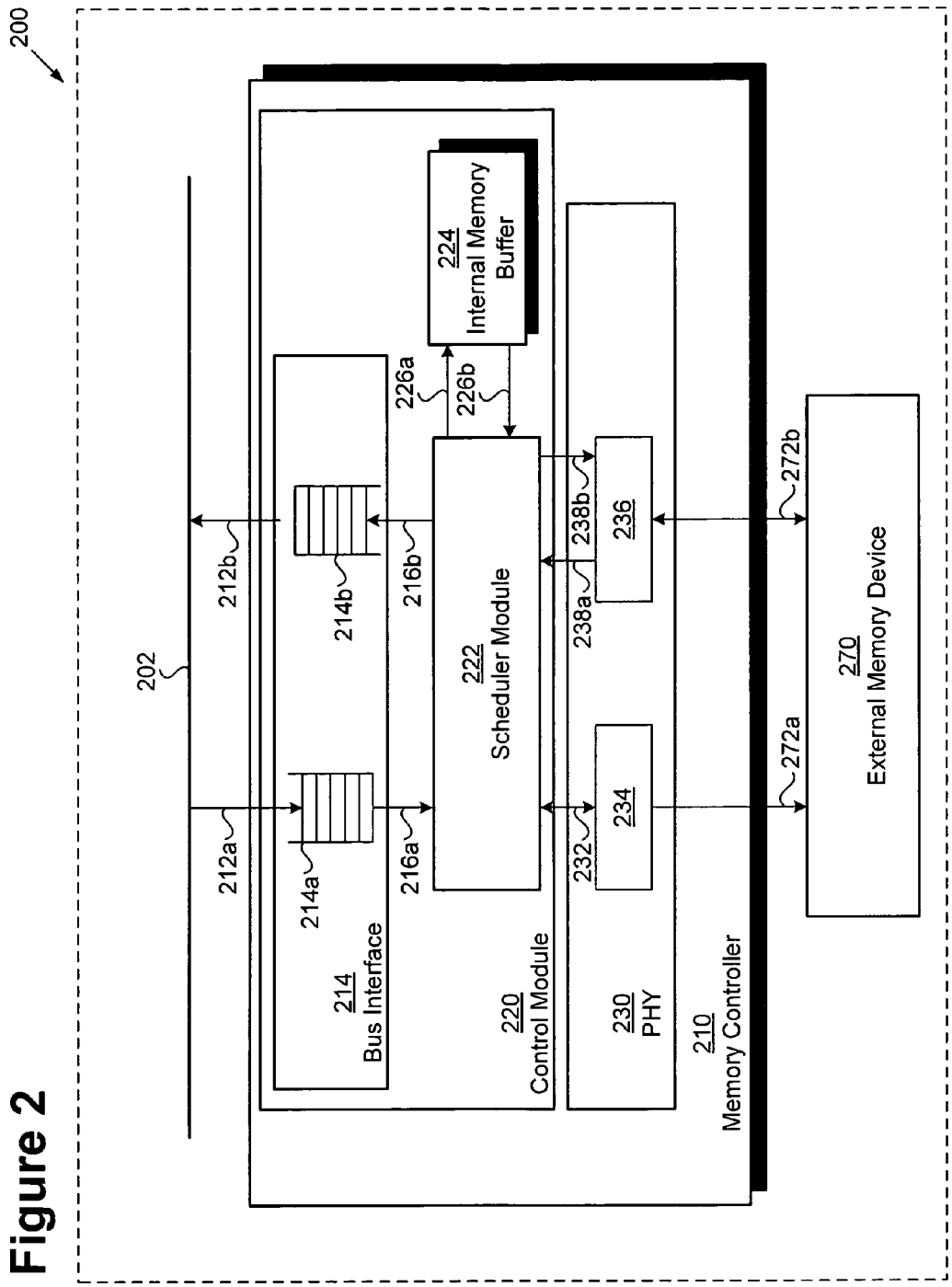
FIG. 2 shows, in more detail, a computer system with a memory controller, according to one embodiment of the present invention.

Referring to FIG. 2, FIG. 2 shows computer system 200, corresponding to a portion of computer system 100 in FIG. 1. Elements within computer system 200 bear similar reference numerals to corresponding elements within computer system 100 in FIG. 1. Computer system 200 may comprise on-chip interconnect 202, memory controller 210, and external memory device 270. External memory device 270 may be a DRAM device or chip, such as a DDR DRAM. Though not pictured in FIG. 2, an embodiment of the present invention may comprise multiple external memory devices, each having a form substantially similar to external memory device 270.

Memory controller 210 may be integrated into an SOC. Memory controller 210 may communicate with on-chip interconnect 202 through input communication signal 212a and output communication signal 212b. In addition, memory controller 210 may access external memory device 270 using address control signal 272a and data control signal 272b.

Internally, memory controller 210 may include control module 220 and PHY 230. PHY 230 may comprise address/command block 234 and data block 236. Each of address/command block 234 and data block 236 may reside between control module 220 and external memory device 270. Address/command block 234 may receive internal address/command signal 232 from control module 220, and may supply address control signal 272a to external memory device 270. Similarly, data block 236 may provide data read signal 238a to control module 222 and may receive data write signal 238b from control module 220. Data block 236 may further supply and receive data control signal 272b to and from external memory device 270.

Control module 220 may include bus interface 214, scheduler module 222, and internal memory buffer 224. As shown, scheduler module 222 may be coupled to internal memory buffer 224 and to bus interface 214. Scheduler module 222 may also be coupled to external memory device 270 through PHY 230.

Bus interface 214 may connect scheduler module 222 to on-chip interconnect 202. Bus interface 214 may receive input communication signal 212a from on-chip interconnect 202, and may provide output communication signal 212b to on-chip interconnect 202. It is noted that on-chip interconnect 202 may be one of an address bus and a data bus. Bus interface 214 may also provide interface signal 216a to scheduler module 222, and may receive interface signal 216b from scheduler module. In one embodiment, bus interface 214 may comprise an input buffer such as input buffer 214a to buffer data from on-chip interconnect 202 to scheduler module 222. Bus interface 214 may further comprise an output buffer such as output buffer 214b to buffer address, command, and data signals from scheduler module 222 to on-chip interconnect 202. In an embodiment, bus interface 214 may be a bus interface unit (BIU). Furthermore, any of input buffer 214a and output buffer 214b may be first-in-first-out (FIFO) buffers or other buffers known in the art.

Internal memory buffer 224 may comprise a RAM device. For example, internal memory buffer 224 may comprise a static RAM (SRAM) device or a DRAM device that is embedded into memory controller 210. Internal memory buffer 224 may be capable of accessing bus interface 214 and need only be sized large enough to emulate read, write, address, command and other operations that memory controller 210 performs on external memory device 270. In an embodiment, internal memory buffer 224 may be significantly smaller than external memory device 270. Moreover, scheduler module 222 may write data and address signals to internal memory buffer 224 through internal memory request signal 226a. Scheduler module 222 may read data and address signals from internal memory buffer 224 through internal memory reply signal 226b.

Internal memory buffer 224 may be configured to operate as an on-chip storage in response to an input signal coming through bus interface 214. More specifically, internal memory buffer 224 may store data in response to signals that come from on-chip interconnect 202 through input buffer 214a.

In one embodiment, internal memory buffer 224 may significantly improve the normal operation of memory controller 210. As a typically small on-chip storage unit, internal memory buffer 224 may function, for instance, as a trace buffer that can hold trace data relating to the functionality of memory controller 210 or external memory device 270. In another embodiment, internal memory buffer 224 may store a security data such as a set of encryption keys that restrict access to portions of memory controller 210 or external memory device 270. In a third embodiment, internal memory buffer 224 may store system boot information, such as boot code, to optimize a boot-up of components including memory controller 210. In a fourth embodiment, internal memory buffer 224 may be used as a fast scratch pad memory to store temporary data.

In yet another embodiment, internal memory buffer 224 may be configured to store a test data during a testing of the chip that contains memory controller 210. For example, internal memory buffer 224 may store a functional test vector that contains test data relating to the functionality of the chip containing memory controller 210. In one embodiment, internal memory buffer 224 may emulate external memory device 270 in response to an input signal at bus interface 214.

Figure 3:
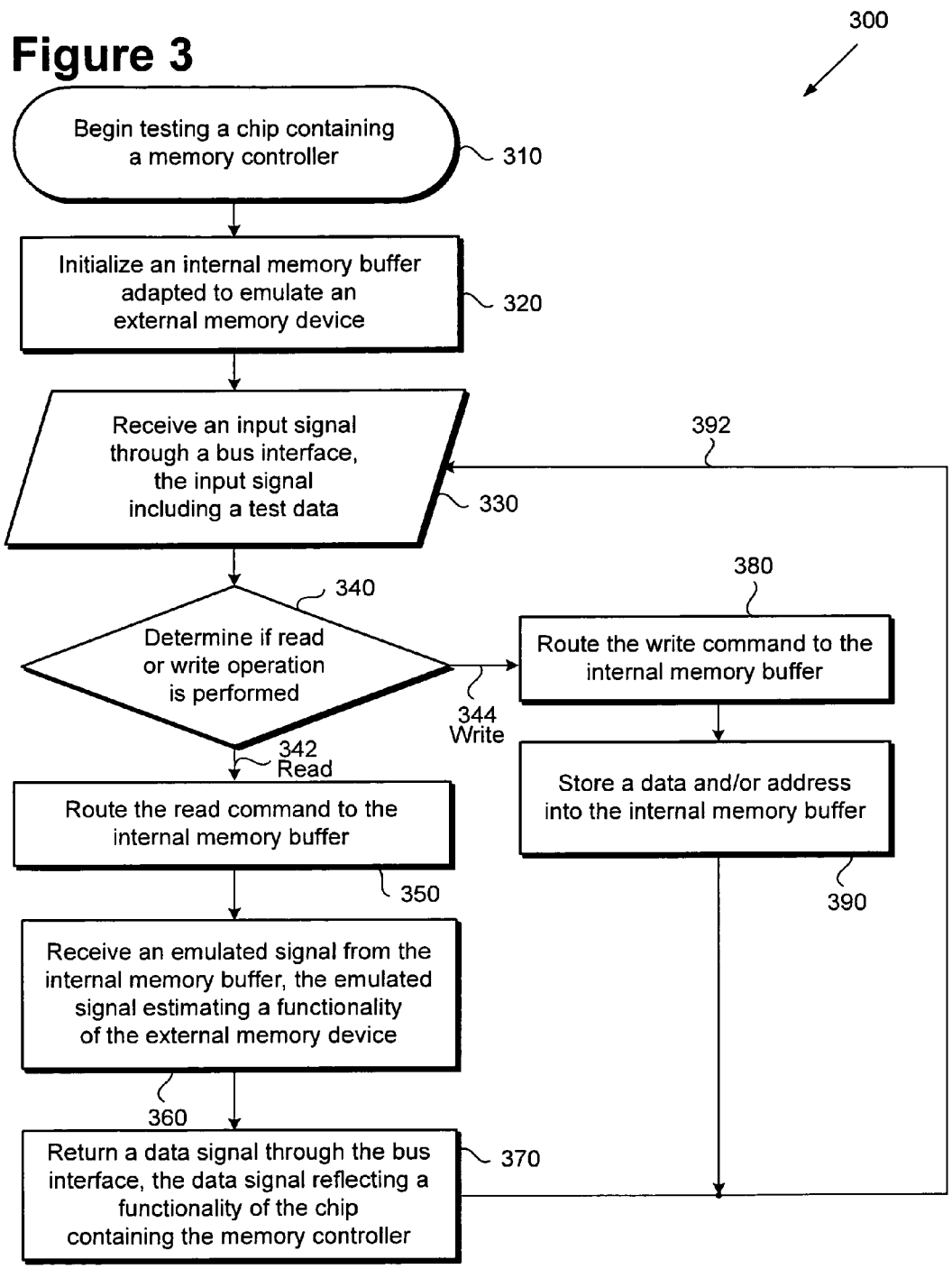
FIG. 3 presents a flowchart that describes the steps of a method to test a chip containing a memory controller, according to one embodiment of the present invention.

Referring to FIG. 3, FIG. 3 illustrates a series of steps that an internal memory buffer can use to emulate an external memory device in response to an input signal at a bus interface. More specifically, flowchart 300 in FIG. 3 further describes an exemplary implementation of the systems embodied in FIGS. 1, 2, and 4 by illustrating the steps, according to one embodiment of the present invention, of a method for testing a chip containing a memory controller. Certain details and features have been left out of to flowchart 300 that are apparent to a person of ordinary skill in the art. For example, a step may comprise one or more substeps that are known in the art. While steps 310 through 390 indicated in flowchart 300 are sufficient to describe one embodiment of the present invention, other embodiments of the invention may utilize steps different from those shown in flowchart 300.

Starting with step 310 of flowchart 300 and referring to FIG. 4, step 310 comprises beginning the testing of a chip containing a memory controller. Referring to ATE environment 400 in FIG. 4, ATE 480 may begin testing chip 410, which DUT 460. As noted above, DUT 460 may contain a memory controller.

Continuing to step 320 of flowchart 300 and referring to FIGS. 2 and 4, step 320 comprises initializing an internal memory buffer that is adapted to emulate an external memory device. Referring to FIG. 4, ATE 480 may initialize a memory buffer that is located inside a memory controller within chip 410. Referring to FIG. 2, ATE (not shown in FIG. 2) may provide data over on-chip interconnect 202 to initialize internal memory buffer 224. More specifically, the ATE may provide data that clears or preloads internal memory buffer 224. In a different embodiment, ATE may use one or more scan chains to initialize the internal memory buffer, such as internal memory buffer 224.

Referring to step 330 of flowchart 300 and FIG. 2, step 330 comprises receiving an input signal through a bus interface of a memory controller. The input signal includes data, such as a command, to test a chip containing a memory controller. Turning to FIG. 2, scheduler module 222 may receive input communication signal 212a through bus interface 214. Input communication signal 212a may include a command such as a functional test vector to test the chip containing memory controller 210. The command may include a command type and an address for some command data (i.e., a write command). For example, input communication signal 212a may comprise a bit stream that is capable of being stored in one or more cells of external memory device 270. This bit stream may be configured to later provide information about the functionality of the chip that contains memory controller 210. For instance, this bit stream may provide information relating to how portions of the chip containing memory controller 210 respond to read or write operations.

Continuing to step 340 of flowchart 300 and referring to FIG. 4, step 340 comprises determining if a read or a write operation is performed. As shown in FIG. 4, ATE 480's test routine may require a read operation, such as read operation 342, or a write operation, such as write operation 344, to be performed on chip 410.

If read operation 352 is to be performed, the method illustrated in flowchart 300 may execute steps 350, 360, and 370. Turning to step 350 of flowchart 300 in FIG. 3 and referring to FIG. 2, step 350 comprises routing the read command to the internal memory buffer. Referring to computer system 200 in FIG. 2, scheduler module 222 may route the command in input communication signal 212a to internal memory buffer 224 through internal memory request signal 226a. Internal memory buffer 224 may be adapted to emulate external memory device 270. For example, internal memory buffer 224 may respond to read and write commands in a manner similar to external memory device 270.

Referring to step 360 of flowchart 300 in FIG. 3 and referring to FIG. 2, step 360 comprises receiving an emulated signal from the internal memory buffer. The emulated signal estimates a functionality of the external memory device. Referring to computer system 200 in FIG. 2, scheduler module 222 may receive internal memory reply signal 226b from internal memory buffer 224. Because internal memory buffer 224 may be configured to emulate external memory device 270, internal memory reply signal 226b may estimate the functionality of external memory device 270.

Continuing to step 370 of flowchart 300 in FIG. 3 and referring to FIG. 2, step 390 comprises returning a reply signal through the bus interface. The reply signal emulates an external memory device. Returning to FIG. 2, scheduler module 222 may return a reply signal, such as output communication signal 212b, to on-chip interconnect 202. The reply signal may indicate whether the chip containing memory controller 210 accurately performed read and write operations. The reply signal could also indicate whether memory controller 210 accurately performed addressing, command, and other operations. The reply signal may therefore reflect a functionality of memory controller 210. As indicated by loop 392, the method illustrated in flowchart 300 of FIG. 3 may return to step 330 to continue with the rest of the test run by ATE to test the chip containing the memory controller. Thus, if read operation 352 is performed, the method illustrated in flowchart 300 may bypass steps 370 and 380 and may execute steps 350, 360, and 370.

However, if write operation 354 is to be performed, the method illustrated in flowchart 300 in FIG. 3 may execute steps 380 and 390. Turning to step 380 of flowchart 300, step 380 comprises routing the write command to the internal memory buffer. Referring to computer system 200 in FIG. 2, scheduler module 222 may route in input communication signals 212a to internal memory buffer 224 through internal memory request signal 226a.

Returning to flowchart 300 in FIG. 3 and continuing to refer to FIG. 2, step 390 of flowchart 300 comprises storing data and in some embodiments an address into the internal memory buffer. Referring to computer system 200 in FIG. 2, on-chip interconnect 202 may pass write commands to scheduler module 222 through input buffer 214a. Scheduler module 222 may then send the write commands from internal memory request signal 226a to internal memory buffer 224, which may store the data and address values present in the write command. As indicated by loop 392, the method illustrated in flowchart 300 of FIG. 3 may return to step 330 to continue with the rest of the test run by ATE to test the chip containing the memory controller.

ATE may test a chip containing a memory controller according to an embodiment of the present invention with a single set of functional test vectors. For example, ATE can test the chip containing a memory controller without the auxiliary tests that conventionally accommodated process variations, non-deterministic timing sources, PHYs, or multi-state buffers.

Moreover, ATE may test a chip containing a memory controller according to an embodiment of the present invention at-speed. More specifically, the data rate to an internal memory buffer need not exceed the rate at which ATE can robustly supply functional test vectors. Embodiments of the present invention therefore reduce test times and accurately represent functionality of a chip containing a memory controller at full data rates.

A memory controller according to an embodiment of the present invention also presents benefits after testing and during normal operation. For example, after a memory controller has passed the testing phase, the internal memory buffer can serve as an on-chip storage unit. More specifically, the internal memory buffer may serve as a trace buffer or may serve to store the read or write address or data traffic of an external memory device or high-speed interfaces. The internal memory buffer may also help store security information or assist in debugging part or all of a chip containing a memory controller.

From the above description, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A memory controller comprising:
   a bus interface;
   scheduler circuitry communicably connected to the bus interface, the scheduler circuitry receiving a control signal from a processor via the bus interface;
   an external interface communicably connected to the scheduler circuitry, the external interface connecting an external device to the scheduler circuitry; and
   an internal memory buffer communicably connected only to the scheduler circuitry, wherein
   the processor emulates testing of the external device by transmitting the control signal to the scheduler circuitry and receiving a communication response from the scheduler circuitry,
   the scheduler circuitry is configured to receive test data via the bus interface and transmit the test data to the internal memory buffer, the test data simulating functionality and performance data of the external device,
   the internal memory buffer is configured to store the test data,
   the scheduler circuitry is further configured to transmit an operation signal to the internal memory buffer, in accordance with the control signal received from the processor, the operation signal to perform read/write operations on the test data stored within the internal memory buffer,
   the internal memory buffer is further configured to perform the read/write operations in accordance with the operation signal and transmit a result signal to the scheduler circuitry, and
   the scheduler circuitry is further configured to receive the result signal from the internal memory buffer and transmit the communication signal to the processor via the bus interface, in accordance with the result signal.

2. The memory controller of claim 1, wherein
   the scheduler circuitry is further configured to receive a security data from the external device via the external interface and transmit the security data to the internal memory buffer, and
   the internal memory buffer is further configured to store the security data.

3. The memory controller of claim 2, wherein
   the scheduler circuitry is further configured to transmit the security data to the processor via the bus interface.

4. The memory controller of claim 1, wherein the internal memory buffer is further configured to function as a trace buffer.

5. The memory controller of claim 1, wherein said external device comprises a dynamic random access memory (DRAM) device.

6. The memory controller of claim 1, wherein said external device comprises a double data rate (DDR) memory device.

7. The memory controller of claim 1, wherein the test data is received from an automated test equipment (ATE).

8. The memory controller of claim 1, wherein the test data comprises a functional test vector.

9. The memory controller of claim 1, wherein said internal memory buffer comprises a static random access memory (SRAM) device.

10. The memory controller of claim 1, wherein said memory controller is incorporated into a system-on-a-chip (SOC).

11. The memory controller of claim 1, wherein
    the bus interface includes an input buffer and an output buffer,
    signals transmitted by to the scheduler circuitry via the bus interface are input by the input buffer to the scheduler circuitry, and
    signals transmitted from the scheduler circuitry via the bus interface are output by the output buffer.

12. The memory controller of claim 1, wherein
    the external interface includes an address block and a data block.

13. The memory controller of claim 1, wherein the processor is external to the memory controller.

14. The memory controller of claim 1, wherein the processor transmits the test data to the scheduler circuitry via the bus interface.

15. The memory controller of claim 1, wherein said bus interface comprises a bus interface unit (BIU).

16. A computer system for testing of an external device, the computer system comprising:
    the memory controller according to claim 1; and
    the processor.

17. A testing system comprising:
    a processor that emulates testing of an external device;
    scheduler circuitry;
    a bus interface that connects the processor to the scheduler circuitry; and
    an internal memory buffer directly connected to the scheduler circuitry, wherein
    the processor emulates testing of the external device by transmitting a control signal to the scheduler circuitry via the bus interface and receiving a communication response from the scheduler circuitry via the bus interface,
    the scheduler circuitry is configured to receive test data via the bus interface and transmit the test data to the internal memory buffer, the test data representing simulated functionality and performance data of the external device,
    the internal memory buffer is configured to store the test data,
    the scheduler circuitry is further configured to transmit an operation signal to the internal memory buffer, in accordance with the control signal, the operation signal including instructions to perform read/write operations on the test data stored by the internal memory buffer,
    the internal memory buffer is further configured to perform the read/write operations in accordance with the operation signal and transmit a result signal to the scheduler circuitry, and
    the scheduler circuitry is further configured to receive the result signal from the internal memory buffer and transmit the communication signal to the processor via the bus interface, in accordance with the result signal.

18. The testing system according to claim 17, wherein
    the bus interface includes an input buffer and an output buffer,
    signals transmitted by to the scheduler circuitry via the bus interface are input by the input buffer to the scheduler circuitry, and signals transmitted from the scheduler circuitry via the bus interface are output by the output buffer.

19. The testing system according to claim 17, wherein the processor transmits the test data to the scheduler circuitry via the bus interface.

20. The testing system according to claim 17, wherein the processor, the scheduler circuitry and the internal memory buffer are incorporated within a system on a chip.

* * * * *